(12) United States Patent
Liang et al.

(10) Patent No.: US 11,289,464 B2
(45) Date of Patent: Mar. 29, 2022

(54) DISPLAY SUBSTRATE, METHOD FOR FABRICATING THE SAME, AND DISPLAY DEVICE

(71) Applicant: BOE TECHNOLOGY GROUP CO., LTD., Beijing (CN)

(72) Inventors: Zhiwei Liang, Beijing (CN); Yingwei Liu, Beijing (CN); Muxin Di, Beijing (CN); Ke Wang, Beijing (CN); Zhanfeng Cao, Beijing (CN); Shibo Jiao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 141 days.

(21) Appl. No.: 16/632,167

(22) PCT Filed: Aug. 6, 2019

(86) PCT No.: PCT/CN2019/099484
§ 371 (c)(1),
(2) Date: Jan. 17, 2020

(87) PCT Pub. No.: WO2020/173049
PCT Pub. Date: Sep. 3, 2020

(65) Prior Publication Data
US 2021/0225823 A1    Jul. 22, 2021

(30) Foreign Application Priority Data

Feb. 28, 2019 (CN) .......................... 201910151312.5

(51) Int. Cl.
*H01L 25/16* (2006.01)
*H01L 27/12* (2006.01)
*H01L 23/00* (2006.01)

(52) U.S. Cl.
CPC ............ *H01L 25/167* (2013.01); *H01L 24/06* (2013.01); *H01L 27/124* (2013.01); *H01L 27/1262* (2013.01); *H01L 2224/06181* (2013.01)

(58) Field of Classification Search
CPC ......... H01L 25/167; H01L 2224/06181; H01L 27/1218; H01L 29/78603; H01L 33/56;
(Continued)

(56) References Cited

U.S. PATENT DOCUMENTS 9,082,997 B2   7/2015   Baek et al.
9,293,737 B2   3/2016   Baek et al.
(Continued)

FOREIGN PATENT DOCUMENTS

CN   101351066 A   1/2009
CN   104064579 A   9/2014
(Continued)

OTHER PUBLICATIONS

Second Chinese Office Action (including English translation) issued in CN201910151312.5, dated Apr. 2, 2021, 17 pages.
(Continued)

*Primary Examiner* — Didarul A Mazumder
(74) *Attorney, Agent, or Firm* — Arch & Lake LLP (57) ABSTRACT

A display substrate, a method for fabricating the same, and a display device are provided. The display substrate includes: a substrate 100 that includes a first via filled with a first conductive section 4011; a drive thin film transistor that is placed on a first side of the substrate and includes a first terminal 2051; and a light emitting diode chip 300 that is placed on a second side of the substrate distal to the drive thin film transistor; wherein the light emitting diode chip 300 includes a first lead 301 and a second lead 302; the first lead 301 is in electrical contact with the first terminal 2051
(Continued)

through the first conductive section 4011; and the second lead 302 is in electrical contact with a second electrode 402 that is placed on the second side of the substrate.

20 Claims, 4 Drawing Sheets

(58) Field of Classification Search
CPC ............. H01L 27/124; H01L 29/41733; H01L 27/3248; H01L 27/3251; H01L 27/3246; H01L 51/0096; H01L 27/3276; H01L 27/322; H01L 27/3253
USPC ..... 257/72; 438/48, 128, 149, 151, 157, 283
See application file for complete search history.

(56) References Cited

U.S. PATENT DOCUMENTS

| | | |
|---|---|---|
| 10,109,655 B2 | 10/2018 | Lee |
| 10,121,838 B2 | 11/2018 | Shim et al. |
| 2008/0197342 A1 | 8/2008 | Lee et al. |
| 2011/0221309 A1* | 9/2011 | Umeki ............... H03H 9/02023 |
| | | 310/344 |
| 2015/0054008 A1 | 2/2015 | Rhee |
| 2016/0293586 A1 | 10/2016 | Ghosh |
| 2017/0012242 A1* | 1/2017 | Choi ................... H01L 51/5256 |
| 2018/0006058 A1* | 1/2018 | Lee ..................... H01L 27/1218 |
| 2018/0114820 A1* | 4/2018 | Shim ................... H01L 27/3248 |

FOREIGN PATENT DOCUMENTS

| | | |
|---|---|---|
| CN | 106486492 A | 3/2017 |
| CN | 106795044 A | 5/2017 |
| CN | 107302011 A | 10/2017 |
| CN | 107564928 A | 1/2018 |
| CN | 107978619 A | 5/2018 |
| CN | 109904186 A | 6/2019 |

OTHER PUBLICATIONS

First Office Action to Chinese Application No. 201910151312.5 dated Jul. 28, 2020 with English translation, (18p).
International Search Report Issued in Application No. PCT/CN2019/099484, dated Sep. 26, 2019, (11p).

* cited by examiner

DISPLAY SUBSTRATE, METHOD FOR FABRICATING THE SAME, AND DISPLAY DEVICE

CROSS-REFERENCE TO RELATED APPLICATIONS

This application is the U.S. national phase of PCT Patent Application No. PCT/CN2019/099484 filed on Aug. 6, 2019, which claims the priority of Chinese Patent Application No. 201910151312.5, filed on Feb. 28, 2019, the entire content of both of which is incorporated herein by reference in their entirety for all purposes.

TECHNICAL FIELD

The present disclosure relates to the technical field of display technology, and particularly relates to a display substrate, a method for fabricating the same, and a display device.

BACKGROUND ART

Mini-LED/Micro-LED display technology relates to a display technology that installs millions of LED chips of micrometer level onto drive backplanes. Each LED can be driven to emit light as an OLED. LEDs, here, are made of inorganic material, and therefore overcoming OLEDs' problems of burn-in and short lifetime. Additionally, LEDs have the features of fast response, high contrast, high color saturation, high resolution, simple structure, lightweight and good bending performance, and thus may be widely used in smartphones, tablets, TVs, AR/VR, wearable devices, large screens, etc. In spite of these features, Mini-LED/Micro-LED is still facing low yield for the mass transfer.

SUMMARY

The present disclosure provides a display substrate, a method for fabricating the same, and a display device.

According to a first aspect of the present disclosure, there is provided a display substrate, including: a substrate that includes a first via filled with a first conductive section; a drive thin film transistor that is placed on a first side of the substrate and includes a first terminal; and a light emitting diode chip that is placed on a second side of the substrate distal to the drive thin film transistor; wherein the light emitting diode chip includes a first lead and a second lead; the first lead is in electrical contact with the first terminal through the first conductive section; and the second lead is in electrical contact with a second electrode that is placed on the second side of the substrate.

The display substrate may further include a first electrode that is sandwiched between the light emitting diode chip and the substrate; and the first lead may be in electrical contact with the first conductive section through the first electrode.

The drive thin film transistor may further include a gate, a second terminal, and an active layer; the first terminal and second terminal may be in electrical contact with the active layer; the gate may be in a gate layer which is insulated from the active layer; and the orthographic projection of the gate on the substrate may cover the orthographic projection of the active layer on the substrate.

The gate layer may be between the active layer and the substrate.

The active layer may be between the gate layer and the substrate.

The substrate may further include a second via; and the display substrate may further include: a second conductive section that is filled in the second via; a third electrode that is placed on the second side of the substrate, wherein the second electrode is in electrical contact with the second conductive section through the third electrode; and a fourth electrode that is placed on the side of the drive thin film transistor that is opposite to the substrate, wherein the fourth electrode is in electrical contact with a common voltage connection terminal and the fourth electrode is in electrical contact with the third electrode through the second conductive section.

The display substrate may further include a passivated layer on the drive thin film transistor, distal from the substrate; and the drive thin film transistor may be between the passivated layer and the substrate.

The display substrate may further include a planarizing layer on the passivated layer, distal from the substrate.

The display substrate may further include: a fifth electrode and a sixth electrode that are placed on the planarizing layer, and wherein the fifth electrode is in electrical contact with a source driver integrated circuit (IC); the sixth electrode is in electrical contact with a gate driver IC; the fifth electrode is in electrical contact with the second terminal of the drive thin film transistor through a first via on the passivated layer and the planarizing layer; and the sixth electrode is in electrical contact with the gate of the drive thin film transistor through a second via on the passivated layer and the planarizing layer.

The first electrode and the first conductive section may be integrally molded and of a same material.

The first conductive section may be of a metal material. The metal material may include Copper (Cu).

The size of the first via may be 10~200 um, the thickness of the first electrode may be 10~20 um, and the thickness of the second electrode may be 10~20 um.

The display substrate may further include: a buffer layer on the substrate; a patterned gate layer on the buffer layer forming a gate of the thin film transistor; a gate insulator layer on the patterned gate layer; a patterned active layer and a patterned conductive layer, wherein the patterned active layer forms an active region of the drive thin film transistor, and the patterned conductive layer includes a first region and a second region forming the first terminal and a second terminal of the drive thin film transistor respectively; and a passivated layer and a planarizing layer on the gate insulator layer and covering the patterned active layer and the patterned conductive layer; wherein the first terminal is in electrical contact with the first lead of the light emitting diode chip through a first via in the gate insulating layer, a first region of the patterned gate layer, and the first conductive section; the second terminal is in electrical contact with a source driver electrode through a first via in the passivated layer and the planarizing layer; and the gate is in electrical contact with a gate driver electrode through a second via in the passivated layer and the planarizing layer, a third region of the patterned conductive layer, and a second via in the gate insulator layer.

According to a second aspect of the present disclosure, there is provided a display device including the display substrate.

According to a third aspect of the present disclosure, there is provided a method for fabricating a display substrate, including: providing a substrate with a modified area, wherein etch selectivity of the modified area is different from etch selectivity of other area on the substrate; forming a drive thin film transistor on a first side of the substrate;

forming a HF protecting film over the drive thin film transistor; etching the substrate in a HF etching solution to form a first via at the modified area; forming a first conductive section filled in the first via, wherein the first conductive section is in electrical contact with a first terminal of the thin film transistor; and placing a light emitting diode chip on the second side of the substrate; wherein a first lead of the light emitting diode chip is in electrical contact with a first terminal of the drive thin film transistor through the first conductive section.

Forming the first conductive section filled in the first via may include: depositing an oxygen-diffusion barrier and a Cu seed layer on a second side of the substrate; electroplating a Cu layer on the second side of the substrate; patterning the Cu layer and forming the first conductive section filled in the first via.

The method may further include forming a passivated layer and a planarizing layer sequentially on the drive thin film transistor; wherein the HF protecting film is formed on the planarizing layer.

The method may further include forming a buffer layer on the first side of the substrate prior to forming the drive thin film transistor.

The method may further include removing the buffer layer at the modified area by dry etching after etching the substrate in the HF etching solution.

The HF protecting film may cover the planarizing layer and side edges of all layers forming the drive thin film transistor on the substrate.

BRIEF DESCIRPTION OF THE DRAWINGS

The accompanying drawings, which are incorporated in and constitute a part of this specification, illustrate examples consistent with the present disclosure and, together with the description, serve to explain the principles of the present disclosure.

DETAILED DESCRIPTION

Reference will now be made in detail to examples of which are illustrated in the accompanying drawings. The following description refers to the accompanying drawings in which the same numbers in different drawings represent the same or similar elements unless otherwise represented. The implementations set forth in the following description of examples do not represent all implementations consistent with the disclosure. Instead, they are merely examples of apparatuses and methods consistent with aspects related to the disclosure as recited in the claims.

The terminology used in the present disclosure is for the purpose of describing exemplary examples only and is not intended to limit the present disclosure. As used in the present disclosure and the claims, the singular forms "a" "an" and "the" are intended to include the plural forms as well, unless the context clearly indicates otherwise. It shall also be understood that the terms "or" and "and/or" as used herein are intended to signify and include any or all possible combination of one or more associated listed items, unless the context clearly indicates otherwise.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to" depending on the context.

Reference throughout this specification to "one example," "an example," "another example," or the like in the singular or plural means that one or more particular features, structures, or characteristics described in connection with an example is included in at least one example of the present disclosure. Thus, the appearances of the phrases "in one example" or "in an example," "in another example," or the like in the singular or plural in various places throughout this specification are not necessarily all referring to the same example. Furthermore, the particular features, structures, or characteristics in one or more examples may include combined in any suitable manner.

One example of the present disclosure provides a display substrate comprising a substrate 100 that comprises a first via; a drive thin film transistor 200A that is placed on a first side of the substrate 100, and comprises a first terminal 2051 and a second terminal 2052; an inorganic light emitting diode chip 300 that is placed on a second side of the substrate, and wherein the inorganic light emitting diode chip 300 comprises a first lead 301 and a second lead 302, the first lead 301 is in electrical contact with the first terminal 2051 through a first conductive section 4011 being filled in the first via, and the second lead 302 is in electrical contact with a second electrode 402 that is placed on the second side of the substrate 100 and is in electrical contact with a common voltage connection terminal.

In one example of the present disclosure, the drive thin film transistor 200A and the inorganic light emitting diode chip 300 are placed on the two sides of the substrate 100, and therefore the substrate 100 is separating the drive thin film transistor 200A and the inorganic light emitting diode chip 300. As a result, the characteristics of the drive thin film transistor 200A will not be impaired when the inorganic light emitting diode chip 300 is being applied with a given force during the bonding of the inorganic light emitting diode chip 300. Therefore, the yield of the display substrate is improved.

In one example of the present disclosure, the substrate 100 may be a rigid substrate, such as a glass substrate, or a silicon substrate. Such a substrate can effectively separate the drive thin film transistor 200A and the inorganic light emitting diode chip 300, and thereby avoiding impairing the drive thin film transistor 200A.

In one example of the present disclosure, the size of the first via of the substrate 100 is 10~200 um. Preferably, the size here is referring to the width (or diameter) of the first via. The width of the first conductive section is large if the size of the first via is large. Additionally, the first conductive section has a large thickness as the substrate has a large thickness, and thereby guaranteeing reliable electrical connection.

In one example of the present disclosure, one of the first terminal 2051 and the second terminal 2052 is a source electrode, and the other one is a drain electrode. The first terminal 2051 is in electrical contact with the first lead 301 of the inorganic light emitting diode chip 300, the second terminal 2052 is in electrical contact with a source driver IC. The first terminal and the second terminal of the drive thin film transistor 200A, and the first lead and the second lead of the inorganic light emitting diode chip 300 are made of conductive materials, such as metal material. Electrical contact, in the present disclosure, comprises direct connection between two conductive parts and connection between the two conductive parts via other conductive part or parts.

In one example of the present disclosure, the drive thin film transistor 200A comprises a gate 2021 and an active layer 204 in addition to the first terminal 2051 and the second 2052. Preferably, the drive thin film transistor 200A may be a bottom gate type drive thin film transistor in order to avoid that the active layer 204 is influenced by the light emitted from the inorganic light emitting diode chip 300. The gate of the drive thin film transistor 200A is placed between the active layer 204 and the substrate 100. The orthographic projection of the gate 2021 on the substrate 100 covers the orthographic projection of the active layer 204 on the substrate, so that the gate 2021 may shield the active layer 204, and the active layer 204 will not be affected by the light emitted from the inorganic light emitting diode chip 300.

In another example of the present disclosure, the drive thin film transistor 200A may be a top gate type drive thin film transistor. A shielding layer is placed between the substrate 100 and the active layer 204, so that the active layer 204 will not be affected by the light emitted from the inorganic light emitting diode chip 300.

In one example of the present disclosure, the first conductive section may be of metal material, so as to improve conductivity. Preferably, the metal material may be Copper (Cu).

In one example of the present disclosure, preferably, the display substrate may comprise a first electrode 4012 that is sandwiched between the inorganic light emitting diode chip 300 and the substrate 100; and wherein the first lead 301 is in electrical contact with the first conductive section 4011 through the first electrode 4012.

In one example of the present disclosure, preferably, the first electrode 4012 and the first conductive section 4011 are integrally molded and of same material. Both the first electrode 4012 and the first conductive section 4011 may be of Copper (Cu).

In one example of the present disclosure, preferably, the thickness of the first electrode is 10~20 um, and the thickness of the second electrode is 10~20 um. The thickness is large so that the electrode may be in reliable electrical connection with the inorganic light emitting diode chip 300.

In one example of the present disclosure, one of the first lead 301 and the second lead 302 is P electrode, and the other one is N electrode. The first lead 301 is in electrical contact with the first terminal 2051 through the first conductive section 4011 and the first electrode 4012. The second lead 302 is in electrical contact with the second electrode 402. The second electrode 402 is connecting the common voltage (VCOM) connection terminal of the drive circuit.

In one example of the present disclosure, the second electrode 402 may be placed on a second side (that is the side of the inorganic light emitting diode chip 300) and in electrical contact with the common voltage connection terminal. Alternatively, the second electrode 402 may be placed on a first side (that is the side of the drive thin film transistor 200A) and in electrical contact with the common voltage connection terminal.

When the second electrode 402 is placed on the first side and in electrical contact with the common voltage connection terminal, the substrate 100 further comprises a second via. The display substrate further comprises a second conductive section 4031 that is filled in the second via; a third electrode 4032 that is placed on the second side of the substrate 100, and the second electrode 402 is in electrical contact with the second conductive section 4031 through the third electrode 4032; and a fourth electrode 2081 that is placed on the side of the drive thin film transistor 200A that is opposite to the substrate 100, the fourth electrode 2081 is in electrical contact with a common voltage connection terminal and the fourth electrode 2081 is in electrical contact with the third electrode 4032 through the second conductive section 4031.

In one example of the present disclosure, preferably, the second conductive section 4031 and the third electrode 4032 are integrally molded and of same material. The material of the second conductive section 4031 may be the same as the first conductive section 4011.

In one example of the present disclosure, the size of the second via may be the same as the size of the first via.

In one example of the present disclosure, the display substrate may further comprise a fifth electrode 2082 and a sixth electrode 2083 that are placed on a side of the drive thin film transistor that is opposite to the substrate 100. The fifth electrode 2082 is in electrical contact with a source driver IC. The sixth electrode 2083 is in electrical contact with a gate driver IC. The fifth electrode 2082 is in electrical contact with the second terminal 2052 of the drive thin film transistor 200A. And the sixth electrode 2083 is in electrical contact with the gate of the drive thin film transistor 200A.

In one example of the present disclosure, the display substrate is in electrical contact with the source driver IC, gate driver electrode and common voltage connection terminal on the first side of the substrate 100 (that is the side of the drive thin film transistor 200A). The whole driver circuit is positioned on the back surface of the display substrate (that is the surface in opposition to the light emitting surface), and therefore enabling a bezel-free display device.

In one example of the present disclosure, the first side of the substrate 100 comprises other film layers in addition to all functional film layers of the drive thin film transistor.

Figure 1:
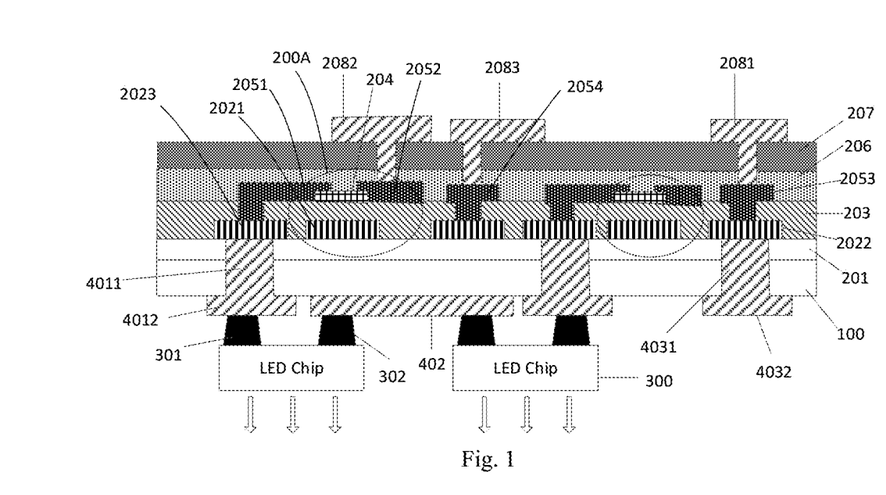
FIG. 1 is a schematic view showing the structure of a display substrate according to one example of the present disclosure.

In the example illustrated in FIG. 1, a display substrate may comprise a buffer 201 made of SiO; a gate metal layer pattern that comprises the gate 2021 of the drive thin film transistor 200A and may also comprises a first connection section 2022; a gate insulator layer 203; and an active layer 204, that is the active layer of the drive thin film transistor and may be made of oxide semiconductor material or low temperature polysilicon (P—Si) semiconductor material, such as IGZO; a source and drain metal layer pattern that comprises the first terminal 2051 and the second terminal 2052 of the drive thin film transistor.

The display substrate may further comprise a second connecting section 2053. The first terminal 2051 is in electrical contact with the first conductive section 4011 through the first connecting section 2022. The display substrate may further comprise a passivated layer PVX 206; a planarizing layer PLN 207; and a drive circuit bonding electrode that may comprises the fourth electrode 2081, the fifth electrode 2082, and the sixth electrode 2083. As illustrated in FIG. 1, the fourth electrode 2081 is in electrical contact with the second conductive section 4031 through the first connecting section 2022 and the second connecting section 2053. The fifth electrode 2082 is in electrical contact with the second terminal 2052 of the drive thin film transistor 200A through a first via in the passivated layer 206 and the planarizing layer 207; and the sixth electrode 2083 is in electrical contact with the gate of the drive thin film transistor 200A through second via in the passivated layer 206 and the planarizing layer 207.

In FIG. 1, the direction indicated by the arrow is the direction in which the inorganic light emitting diode IC 300 emits light. And the inorganic light emitting diode IC 300 may be a flip chip, a traditional carrier-based chip, or a vertical structured chip.

In one example of the present disclosure, the inorganic light emitting diode chip 300 may be a Mini-LED chip (the size is 100~200 um) or a Micro-LED chip (the size is smaller than 100 um).

In one embodiment, the display substrate comprises a substrate 100 that comprises a first via filled with a first conductive section 4011; a drive thin film transistor that is placed on a first side of the substrate and comprises a first terminal 2051; and a light emitting diode chip 300 that is placed on a second side of the substrate distal to the drive thin film transistor; wherein the light emitting diode chip 300 comprises a first lead 301 and a second lead 302; the first lead 301 is in electrical contact with the first terminal 2051 through the first conductive section 4011; and the second lead 302 is in electrical contact with a second electrode 402 that is placed on the second side of the substrate. The display substrate may further comprise a buffer layer 201 on the substrate; a patterned gate layer on the buffer layer forming a gate 2021 of the thin film transistor; a gate insulator layer 203 on the patterned gate layer; a patterned active layer 204 and a patterned conductive layer 2051, 2052, 2053, wherein the patterned active layer forms an active region 204 of the drive thin film transistor, and the patterned conductive layer comprises a first region and a second region forming the first terminal 2051 and a second terminal 2052 of the drive thin film transistor respectively; and a passivated layer 206 and a planarizing layer 207 on the gate insulator layer and covering the patterned active layer and the patterned conductive layer; wherein the first terminal 2051 is in electrical contact with the first lead 301 of the light emitting diode chip through a first via in the gate insulating layer 203, a first region of the patterned gate layer 2023, and the first conductive section 4011; the second terminal 2052 is in electrical contact with a source driver electrode 2082 through a first via in the passivated layer 206 and the planarizing layer 207; and the gate 2021 is in electrical contact with a gate driver electrode 2083 through a second via in the passivated layer 206 and the planarizing layer 207, a third region of the patterned conductive layer 2054, and a second via in the gate insulator layer 203.

Figure 5:
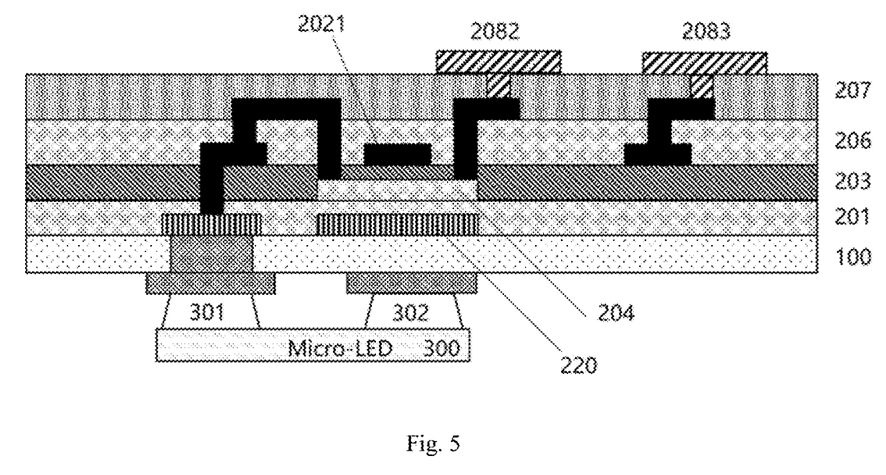
FIG. 5 is a schematic view showing the structure of a display substrate according to another example of the present disclosure.

In another embodiment, as shown in FIG. 5, a top gate structure may be formed. The active layer 204 may be formed on the buffer layer 201, and the gate 2021 may be formed on the gate insulating layer 203. Optionally, a shield layer 220 may be formed on the substrate 100 prior to forming the buffer layer 201. The shield layer 220 may reduce influences on the active layer 204 by other components, such as the second lead 302 of the micro-LED 300.

One example of the present disclosure provides a display device comprising any of the display substrates of all the examples above.

Figure 2:
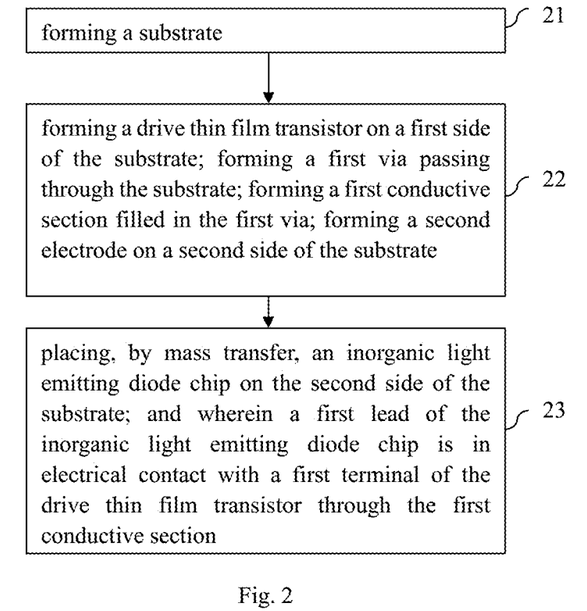
FIG. 2 illustrates a schematic view showing one method of fabricating a display substrate according to another example of the present disclosure.

As illustrated in FIG. 2, one example of the present disclosure provides a method for fabricating a display substrate comprising:

Step 21: providing a substrate;

Step 22: forming a drive thin film transistor on a first side of the substrate; forming a first via passing through the substrate; forming a first conductive section filled in the first via; forming a second electrode on a second side of the substrate, and the second electrode is in electrical contact with a common voltage connection terminal;

Step 23: placing, by mass transfer, an inorganic light emitting diode chip on the second side of the substrate; and wherein a first lead of the inorganic light emitting diode chip is in electrical contact with a first terminal of the drive thin film transistor through the first conductive section; and a second lead of the inorganic light emitting diode chip is in electrical contact with the second electrode.

In this example of the present disclosure, a mass transfer device aligns electrodes of the inorganic light emitting diode chip and the substrate, and applies a given force so as to connect the electrodes of the inorganic light emitting diode chip and the substrate. The characteristics of the drive thin film transistor 200A will be impaired if the inorganic light emitting diode chip and the substrate are on the same side of the substrate and the force is not given appropriately during the bonding of the inorganic light emitting diode chip. In this example of the present disclosure, the inorganic light emitting diode chip and the substrate are separately placed on the two different sides of the substrate. As a result, the characteristics of the drive thin film transistor 200A will not be impaired if the force is not given appropriately during the bonding of the inorganic light emitting diode chip, and the yield of the substrate is improved.

In one example of the present disclosure, when forming the drive thin film transistor, a high temperature process (normally between 300° C.~400° C.) is applied in fabricating the drive thin film transistor. The first conductive section (generally made of metal) of the first via will expand, and therefore causing undesired influence to the drive thin film transistor. In the step 22 above, therefore, one example of the present disclosure forms the drive thin film transistor first, and then forms the first via and the first conductive section in the first via, and thereby avoiding the undesired influence caused by the expanding of the first conductive section. Meanwhile, such a solution resolves the oxidation and the scratch of the back surface of the first conductive section during the process of fabricating the drive thin film transistor.

Alternatively, in one example of the present disclosure, the step 22 above forms the drive thin film transistor directly on the substrate (Through Glass Via (TGV) substrate) comprising the first via and the first conductive section, that is, the step 22 forms the first via and the first conductive section first, and then form the drive thin film transistor.

In one example of the present disclosure, preferably, before the step of placing, by mass transfer, an inorganic light emitting diode chip on the second side of the substrate, the method further comprises the step of forming, on the second side of the substrate, a first electrode that is in electrical contact with the first conductive section, and wherein the first electrode is in electrical contact with the first lead of the inorganic light emitting diode chip.

Figure 3:
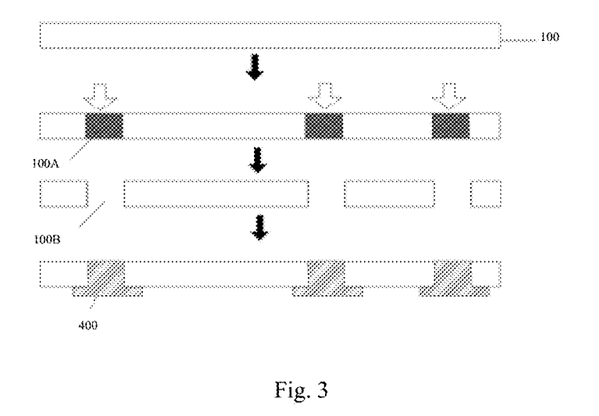
FIG. 3 is a schematic view showing a method of fabricating a Through Glass Via (TGV) substrate according to another example of the present disclosure.

In one example of the present disclosure, as illustrated in FIG. 3, the step of forming a first via passing through the substrate further comprises the following steps: before forming the drive thin film transistor on a first side of the substrate, irradiating, by laser, the area of the substrate 100 on which the first via is placed, and then forming a modified area 100A; and wherein the etch selectivity of the modified area 100A is different from the etch selectivity of other area on the substrate 100; etching, by using etching solution, the substrate 100, and forming the first via 100B passing through the substrate on the modified area 100A.

In one example of the present disclosure, the laser used to modify the substrate 100 may be a laser with a specific wavelength. If the substrate is a glass substrate, the etching solution may be HF etching solution. The via can be formed on the modified area 100A because the etch rate of the modified area 100A is higher than other areas on the substrate.

In one example of the present disclosure, the film layer of the substrate 100 is not immersed into the etching solution when the substrate 100 is immersed, so that the film layer of the substrate is not etched.

In one example of the present disclosure, the drive thin film transistor can be protected from being influenced by laser during the modification by modifying the substrate first and then forming the drive thin film transistor.

In one example of the present disclosure, the first conductive section and the first electrode may be made of metal material. Preferably, they are made of Copper (Cu) so as to improve conductivity. When the first conductive section and the first electrode are made of Cu, the step of forming the first conductive section and the first electrode may comprise the step of forming the first conductive section and the first electrode by electroplating process and patterning process.

Specifically, during the electroplating process, an oxygen-diffusion barrier is formed in the first via so as to prevent oxygen diffusion. Ta or TaN may be used as the oxygen-diffusion barrier. Then, a Cu seed layer is covered on the surface of the oxygen-diffusion barrier and is used for conducting. The first conductive section is then formed in the first via by the electroplating process, a Cu film layer is formed on the surface of the substrate by the electroplating process, and the first electrode is formed by the patterning process.

Figure 4:
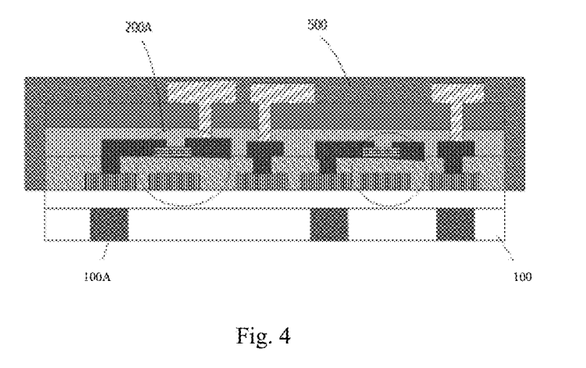
FIG. 4 is a schematic view showing a method for using a protective film according to another example of the present disclosure.

In one example of the present disclosure, as illustrated in FIG. 4, before the step of etching, by using etching solution, the substrate, the method further comprises: attaching a protective film to the display substrate (protective film 500 as shown in FIG. 4). The protective film covers the front surface and the side surface of the film layer that is on the first side of the substrate. The protective film is used for protecting the film layer on the first side of the substrate from being etched by the etching solution.

In one example of the present invention, before the etching, the film layer of the first side of the substrate is protected by the protective film in order to prevent the film layer during the etching process.

Specifically, the protective film 500 may be of Polyvinylchloride (PVC), Polypropylene (PP), or Polytetrafluoroethylene (F4). The protective film with an attaching layer attaches the outside of the area requiring protection of the display panel, and is removed after the etching process.

In one example of the present disclosure, after the step of placing, by mass transfer, an inorganic light emitting diode chip on the second side of the substrate, the method further comprises:

Forming a packaging layer that packages the inorganic light emitting diode chip on a side of the inorganic light emitting diode chip that is opposite to the substrate;

Removing the protective film.

That is, the protective film is removed after the packaging of the inorganic light emitting diode chip is finished, and thereby reducing the influence on the backplane functional layers during the bonding and packaging processes.

In one example of the present disclosure, preferably, the substrate further comprises a second via. The display substrate further comprises: a second conductive section that is filled in the second via; a third electrode that is placed on the second side of the substrate, and the second electrode is in electrical contact with the second conductive section through the third electrode; and a fourth electrode that is placed on a side of the drive thin film transistor that is opposite to the substrate, the fourth electrode is in electrical contact with a common voltage connection terminal and the fourth electrode is in electrical contact with the third electrode through the second conductive section.

In one example of the present disclosure, preferably, the display substrate further comprises a fifth electrode and a sixth electrode that are placed on a side of the drive thin film transistor that is opposite to the substrate. The fifth electrode is in electrical contact with a source driver IC, the sixth electrode is in electrical contact with a gate drive IC, the fifth electrode is in electrical contact with the second terminal of the drive thin film transistor, and the sixth electrode is in electrical contact with the base of the drive thin film transistor.

In one example of the present disclosure, the display substrate is in electrical contact with the source driver IC, gate driver electrode and common voltage connection terminal on the first side of the substrate (that is the side of the drive thin film transistor). The whole driver circuit is positioned on the back surface of the display substrate (that is the surface in opposition to the light emitting surface), and therefore enabling a bezel-free display device.

In one example of the present disclosure, preferably, the first conductive section and the first electrode are made of metal material. The electrical contact between the first lead of the inorganic light emitting diode chip and the first terminal of the drive thin film transistor through the first conductive section, and, between the second lead of the inorganic light emitting diode chip and the second electrode, may comprises metal—metal bonding, soldering, or electroconductive paste.

In one example of the present disclosure, the metal—metal bonding is referring to metal—meatal bonding under a certain temperature and a first pressure. Preferably, the temperature may be 160~100° C., and the pressure is smaller than 100 kPa.

In one example of the present disclosure, the soldering may use Sn—Ag—Cu or In—Sn.

In one example of the present disclosure, the electroconductive paste may be anisotropic conductive paste (ACP).

Specifically, as ITO/Ag/ITO coextruded films are used for fabricating the bonding electrodes that bond the inorganic light emitting diode chip, the metal—metal bonding process cannot be used for bonding the inorganic light emitting diode chip. Instead, silver paste and ITO/Ag/ITO are generally used for bonding and the bonding temperature is around 100° C. The inorganic light emitting diode chip, however, under this bonding process, has low electrical connectivity and is easily delaminatable. Specifically, when removing the inorganic light emitting diode chip for the purpose of restoring, the ITO bonding the electrode has low adhesivity and is therefore easily delaminatable. As a result, the restoring process requires more than once restoring while the ITO is already delaminated, and Ag is exposed and easily oxidized.

In one example of the present disclosure, the inorganic light emitting diode chip and the drive thin film transistor are connected by the metal—metal bonding or soldering because metal electrodes with high thickness are used for connecting the inorganic light emitting diode chip and the drive thin film transistor, and thereby guaranteeing reliable electrical connection. Additionally, the restoring of the inorganic light emitting diode chip is facilitated because the metal electrodes have high thickness and metal is not easily delaminatable comparing with ITO.

Below is the explanation of a method for fabricating the display substrate in one example of the present disclosure, referring to both FIGS. 1 and 4.

FIG. 1 is illustrating, but not limited to, BCE structured Oxide TFT as an example of the drive thin film transistor. The method for fabricating the display substrate comprises:

Providing a substrate 100, irradiating by laser, the area of the substrate on which the first via and the second via are placed, and then forming a modified area; and wherein the etch selectivity of the modified area is different from the etch selectivity of other area on the substrate;

Forming a buffer 201 on the modified substrate 100, depositing a gate metal layer, patterning the gate metal layer, and forming a gate metal layer pattern; and wherein the gate metal layer pattern comprises a gate 2021 and a first connecting section 2022;

Depositing a gate insulator layer, and drilling on a specific area on the gate insulator layer;

Depositing an IGZO layer, patterning the IGZO layer, and forming an active layer;

Depositing a source and drain metal layer, patterning the source and drain metal layer, and forming source and drain metal layer pattern; and wherein the source and drain metal layer pattern comprises a first terminal 2051, a second terminal 2052, and a second connecting section 2053;

Depositing a passivated layer PVX 206;

Forming a planarizing layer PLN 207;

Depositing the metal layer, patterning the metal layer, and forming a driver IC bonding Pad; and wherein the Driver IC bonding Pad comprises a fourth electrode 2081, a fifth electrode 2082, and a sixth electrode 2083, the fourth electrode 2081 is in electrical contact with a common voltage connection terminal, the fifth electrode 2082 is in electrical contact with a source driver IC, and the sixth electrode 2083 is in electrical contact with a gate driver IC.

The steps above fabricate the functional layers of the backplane.

Attaching a protective film (protective film 500 as shown in FIG. 4) to the display substrate; and wherein the protective film covers the front surface and the side surface of the film layer on the substrate;

Immersing the substrate 100 into HF etching solution, etching the modified area that is irradiated by laser, and forming a first via and a second via passing through the substrate; additionally, etching the buffer by dry etching while treating the substrate as a hard mask, forming a via connecting with the first via and the second via, depositing an oxygen-diffusion barrier and a Cu seed layer, electroplating the Cu seed layer with a thickness of 10~20 um onto the whole surface of the substrate 100, patterning the Cu seed layer, and forming the first conductive section filled in the first via and the second conductive section filled in the second via, and the first electrode, the second electrode and the third electrode on the second side of the substrate;

Placing, by mass transfer, the inorganic light emitting diode chip 300 on the second side of the substrate 100; and wherein the first lead of the inorganic light emitting diode chip 300 is in electrical contact with a first terminal of the drive thin film transistor through the first conductive section; and the second lead of the inorganic light emitting diode chip is in electrical contact with the second electrode; and Removing the protective film 50 after finishing the bonding and packaging of the inorganic light emitting diode chip 300.

Figure 6:
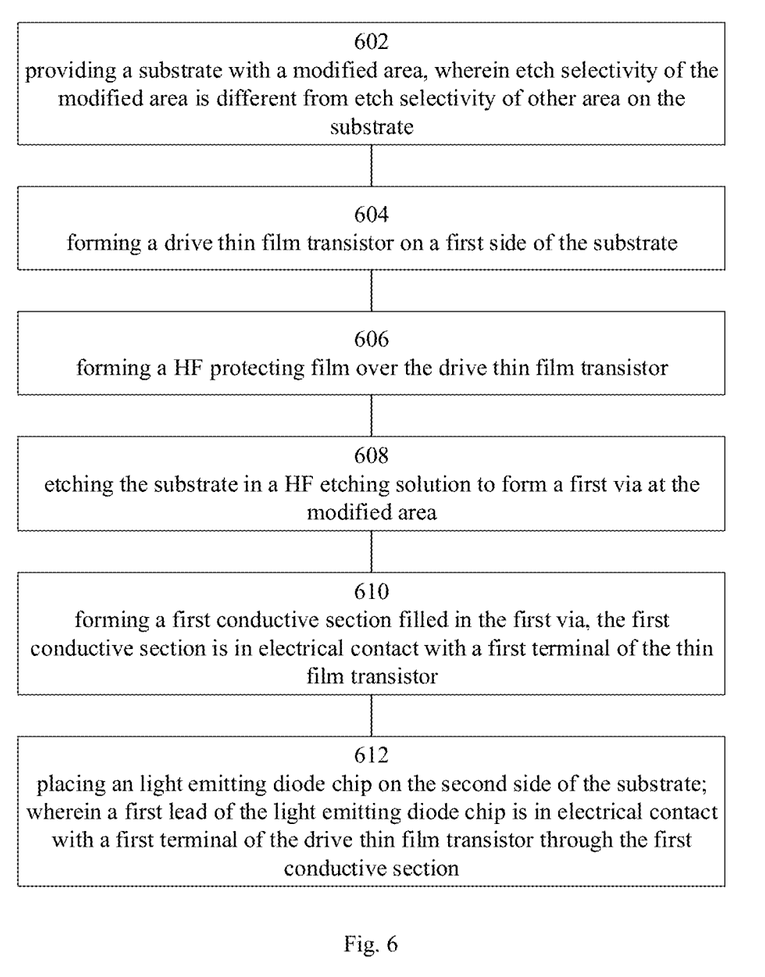
FIG. 6 is a schematic view showing another method for fabricating a display panel according to another example of the present disclosure.

In another embodiment, As shown in FIG. 6, the method may comprise: step 602, providing a substrate with a modified area, wherein etch selectivity of the modified area is different from etch selectivity of other area on the substrate; step 604, forming a drive thin film transistor on a first side of the substrate; step 606, forming a HF protecting film over the drive thin film transistor; step 608, etching the substrate in a HF etching solution to form a first via at the modified area; step 610, forming a first conductive section filled in the first via, the first conductive section is in electrical contact with a first terminal of the thin film transistor; and step 612, placing a light emitting diode chip on the second side of the substrate; wherein a first lead of the light emitting diode chip is in electrical contact with a first terminal of the drive thin film transistor through the first conductive section.

The method may further comprise forming a passivated layer and a planarizing layer sequentially on the drive thin film transistor; and the HF protecting film is formed on the planarizing layer. The HF protecting film may cover the planarizing layer and side edges of all layers forming the drive thin film transistor on the substrate. The method may further comprise forming a buffer layer on the first side of the substrate prior to forming the drive thin film transistor; and removing the buffer layer at the modified area by dry etching after etching the substrate in the HF etching solution.

It should be noted that the examples of the present disclosure are well implemented, and do not make limitations of any form to the present disclosure. Any changes or modifications that may be made by the technicians familiar with this field using the above-disclosed technical contents are equally effective examples. Any modifications or equivalent changes and polishes made on the above disclosed examples, which are not independent of the contents of the technical schemes of the present disclosure, and are in accordance with the technical essence of the present disclosure, and are in accordance with the technical essence of the present disclosure, are still covered in the scope of the technical schemes of the present disclosure.

What is claimed is:

1. A display substrate, comprising:
    a substrate comprising a first via filled with a first conductive section and a second via filled with a second conductive section;
    a drive thin film transistor placed on a first side of the substrate and comprises a first terminal; and
    a light emitting diode chip placed on a second side of the substrate distal to the drive thin film transistor;
    wherein the light emitting diode chip comprises a first lead and a second lead;
    the first lead is in electrical contact with the first terminal through the first conductive section;

the second lead is in electrical contact with a second electrode placed on the second side of the substrate; and a third electrode is placed on the second side of the substrate, wherein the second electrode is in electrical contact with the second conductive section through the third electrode.

2. The display substrate of claim 1, further comprising:
a first electrode sandwiched between the light emitting diode chip and the substrate;
and wherein the first lead is in electrical contact with the first conductive section through the first electrode.

3. The display substrate of claim 1, wherein the drive thin film transistor further comprises a gate, a second terminal, and an active layer;
the first terminal and the second terminal are in electrical contact with the active layer;
the gate is in a gate layer which is insulated from the active layer; and
an orthographic projection of the gate on the substrate covers the orthographic projection of the active layer on the substrate.

4. The display substrate of claim 3, wherein the gate layer is between the active layer and the substrate.

5. The display substrate of claim 3, wherein the active layer is between the gate layer and the substrate.

6. The display substrate of claim 1, wherein the display substrate further comprises:
a fourth electrode placed on the side of the drive thin film transistor opposite to the substrate, wherein the fourth electrode is in electrical contact with a common voltage connection terminal and the fourth electrode is in electrical contact with the third electrode through the second conductive section.

7. The display substrate of claim 3, further comprising:
a passivated layer on the drive thin film transistor distal from the substrate; wherein the drive thin film transistor is between the passivated layer and the substrate.

8. The display substrate of claim 7, further comprising:
a planarizing layer on the passivated layer distal from the substrate.

9. The display substrate of claim 8, further comprising:
a fifth electrode and a sixth electrode placed on the planarizing layer, and wherein
the fifth electrode is in electrical contact with a source driver integrated circuit (IC);
the sixth electrode is in electrical contact with a gate driver IC;
the fifth electrode is in electrical contact with the second terminal of the drive thin film transistor through a first via on the passivated layer and the planarizing layer; and
the sixth electrode is in electrical contact with the gate of the drive thin film transistor through a second via on the passivated layer and the planarizing layer.

10. The display substrate of claim 2, wherein the first electrode and the first conductive section are integrally molded and of a same material.

11. The display substrate of claim 1, wherein the first conductive section is made of a metal material.

12. The display substrate of claim 2, wherein a size of the first via is 10~200 um, a thickness of the first electrode is 10~20 um, and a thickness of the second electrode is 10~20 um.

13. The display substrate of claim 1, further comprising:
a buffer layer on the substrate;

a patterned gate layer on the buffer layer forming a gate of the drive thin film transistor;
a gate insulator layer on the patterned gate layer;
a patterned active layer and a patterned conductive layer, wherein the patterned active layer forms an active region of the drive thin film transistor, and the patterned conductive layer comprises a first region and a second region forming the first terminal and a second terminal of the drive thin film transistor respectively; and
a passivated layer and a planarizing layer on the gate insulator layer and covering the patterned active layer and the patterned conductive layer;
wherein the first terminal is in electrical contact with the first lead of the light emitting diode chip through the first via, the gate insulator layer, a first region of the patterned gate layer, and the first conductive section;
the second terminal is in electrical contact with a source driver electrode through the first via in the passivated layer and the planarizing layer; and
the gate is in electrical contact with a gate driver electrode through a second via in the passivated layer and the planarizing layer, a third region of the patterned conductive layer, and the second via in the gate insulator layer.

14. A display device comprising a display substrate, wherein the display substrate comprises:
a substrate comprising a first via filled with a first conductive section and a second via filled with a second conductive section;
a drive thin film transistor placed on a first side of the substrate and comprises a first terminal; and
a light emitting diode chip placed on a second side of the substrate distal to the drive thin film transistor;
wherein the light emitting diode chip comprises a first lead and a second lead;
the first lead is in electrical contact with the first terminal through the first conductive section;
the second lead is in electrical contact with a second electrode placed on the second side of the substrate; and
a third electrode is placed on the second side of the substrate, wherein the second electrode is in electrical contact with the second conductive section through the third electrode.

15. A method for fabricating a display substrate comprising:
providing a substrate with a modified area, wherein an etch selectivity of the modified area is different from an etch selectivity of other area on the substrate;
forming a drive thin film transistor on a first side of the substrate;
forming a HF protecting film over the drive thin film transistor;
etching the substrate in a HF etching solution to form a first via and a second via at the modified area;
forming a first conductive section filled in the first via, wherein the first conductive section is in electrical contact with a first terminal of the drive thin film transistor;
forming a second conductive section filled in the second via; and
placing a light emitting diode chip on a second side of the substrate; wherein
a first lead of the light emitting diode chip is in electrical contact with a first terminal of the drive thin film transistor through the first conductive section;

a second lead of the light emitting diode chip is in electrical contact with a second electrode placed on the second side of the substrate; and the second electrode is in electrical contact with the second conductive section through a third electrode.

16. The method of claim 15, wherein forming the first conductive section filled in the first via comprises:

depositing an oxygen-diffusion barrier and a Cu seed layer on the second side of the substrate;

electroplating a Cu layer on the second side of the substrate;

patterning the Cu layer and forming the first conductive section filled in the first via.

17. The method of claim 15, further comprising:

forming a passivated layer and a planarizing layer sequentially on the drive thin film transistor;

wherein the HF protecting film is formed on the planarizing layer.

18. The method of claim 15, further comprising: forming a buffer layer on the first side of the substrate prior to forming the drive thin film transistor.

19. The method of claim 18, further comprising: removing the buffer layer at the modified area by dry etching after etching the substrate in the HF etching solution.

20. The method of claim 15, wherein the HF protecting film covers the planarizing layer and side edges of all layers forming the drive thin film transistor on the substrate.

* * * * *